June 23, 1953 | P. R. AIGRAIN | 2,643,293

VOLUME CONTROL FOR PULSE CODE MODULATION

Filed June 19, 1948 | 2 Sheets-Sheet 1

INVENTOR.
PIERRE R. AIGRAIN

BY R. P. Morris

ATTORNEY

June 23, 1953 P. R. AIGRAIN 2,643,293

VOLUME CONTROL FOR PULSE CODE MODULATION

Filed June 19, 1948 2 Sheets-Sheet 2

INVENTOR.
PIERRE R. AIGRAIN

BY

ATTORNEY

Patented June 23, 1953

2,643,293

UNITED STATES PATENT OFFICE 2,643,293

VOLUME CONTROL FOR PULSE CODE MODULATION

Pierre Raoul Aigrain, New York, N. Y., assignor to International Standard Electric Corporation, New York, N. Y., a corporation of Delaware Application June 19, 1948, Serial No. 34,097

8 Claims. (Cl. 178—43.5)

This invention relates to a pulse code modulation communication system and more particularly to a signal amplitude volume control for such a system.

In converting amplitude variable signals into pulse code modulation quantizing is required, that is an average level rather than the true signal is used for obtaining the respective pulse code from period to period. Such a process, of course, induces unavoidable distortions which may be expressed as the difference between the respective selected level and the true slope of the signal. It can be shown that the distortion can be made a minimum at an optimum level amplitude distribution during quantizing. In order to obtain acceptable results over the wide dynamic range of voice signals encountered in practice, the usual procedure is to use an uneven level spacing. This can be shown however to increase the minimum value of distortion obtainable for a given number of levels.

It is an object of this invention to provide a pulse code modulation system possessing characteristics which are productive of a minimum signal distortion when quantizing an amplitude modulated signal for conversion into pulse code modulation.

A further object is to provide a pulse code modulation system wherein the distortion due to quantizing is held to a minimum by emphasizing an optimum level amplitude distribution for the quantized signal values.

Another object is to provide a system of the above type wherein the desired optimum level amplitude distribution is obtained by means of an automatic volume control applied to the original signal as a function of the resultant pulse code.

In accordance with certain features of the invention a determination can be made of the optimum level amplitude distribution of a quantized signal at which level a minimum amount of distortion is obtained by substantially restricting the average level amplitude distribution to a predetermined optimum level. In accordance with standard practice a group of pulses is obtained for transmission at each sampling of the amplitude modulated signal. Depending on the character of the distribution of these pulses cognizance is taken as to whether or not the input signal which has resulted in these pulses falls within some particular level range. Thus, for instance, in conventional pulse code modulation practice, the first two digits will be of the same nature, that is, both will be on or both will be off, if the absolute value of the input signal exceeds a given median level or fails to attain the same respectively. Accordingly, a circuit has been provided which will:

*a*. Recognize whether a given voltage level range has or has not been attained: or at each sampling;

*b*. Vary the gain by a positive percentage if the level has not been exceeded and by a negative percentage if it has been exceeded.

Since the same group of impulses will be available at the receiver the same type of circuit can be used to vary the gain in the opposite sense and thus reconstruct the original signal. As a practical concept of this idea a so-called signal compressor has been proposed which operates such as to isolate the first two pulses or pulse digits resulting from each sampling which are utilized for the control of a so-called scale-of-two circuit resulting in a correspondingly negative or positive output therefrom. This output after integration is used to control the gain of an amplifier translating the amplitude modulated signal which is to be transmitted. The action of the compressor is based on the concept that the incidence of the resulting level distribution is probable over a larger percentage of the time within a desired range due to the control applied. At the same time one of the more important characteristics of the gain control will be that the percentage changes, both positive and negative, will not vary to any extent from sampling to sampling whereby a dependable and quickly acting volume control will be realized.

These and other features and objects of the invention will become more apparent and the invention itself, though not necessarily defined by said features and objects, will be clearly understood by reference to the following description of an embodiment of the invention taken in connection with the accompanying drawings wherein.

Figure 1:
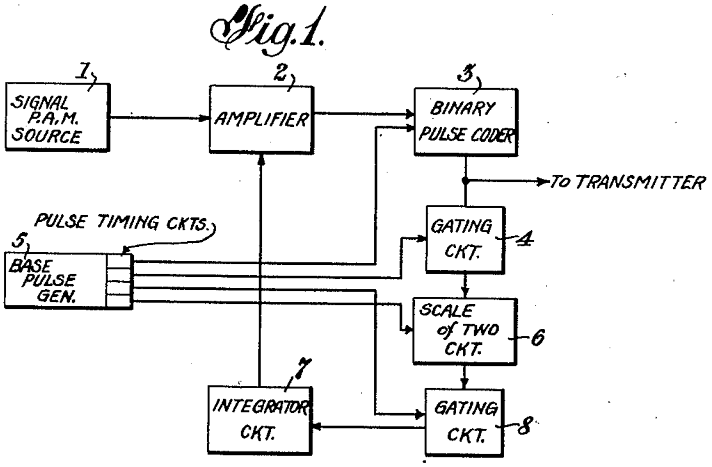
Fig. 1 is a diagram in block form of a pulse code modulation system incorporating the volume control of the invention.

Referring to the system shown in Fig. 1, a source of an amplitude modulated signal which may be in the form amplitude modulated pulses as derived from an amplitude modulated signal wave is indicated at 1. These amplitude modulated signals or pulses from source 1 are applied to an amplifier 2 whence they are conducted to a binary pulse coder 3 which, in accordance with well established pulse code practice includes the necessary elements for converting an amplitude modulated signal into corresponding groups of coded pulses each of which represents a definite amplitude level as obtained by quantizing or sampling the original signal from period to period. The output of the coder 3 is fed into a transmitter (not shown) and also into a gating circuit 4 which also receives a timing control pulse from a base pulse generator 5. The gating circuit 4 may be of the type which upon application thereto of a trigger impulse from the generator 5 provides a square type gating pulse according to the form shown in Fig. 3*b*. These gating pulses are timed to occur at the beginning of each code group and of a duration so as to span the first two coding digits.

The base pulse generator 5 may be a sine wave oscillator from which narrow pulses are derived having a suitable cadence frequency. These pulses may through the medium of frequency dividing or delay circuits associated with the generator be converted into pulses of different frequencies for triggering and controlling the various circuits of the system as indicated. Thus coder circuit 3 will be supplied impulses to make possible an output therefrom of code pulse groups having a maximum of five consecutive pulses in accordance with the applied signal. The digits separated by gating circuit 4 are fed to a regularly-reset scale-of-two or flip-flop circuit 6 the output of which may be either positive or negative over certain periods of time depending on the character of the input pulse digits. A connection is also provided from generator 5 to the flip-flop 6 for triggering or resetting control thereof at suitable periods as will be explained hereafter in connection with graph *c'* in Fig. 3. The pulses from generator 5 serve to "flip" the circuit 6, that is they are so connected that each pulse from generator 5 will trigger circuit 6 into its second level of stability. If circuit 6 is already in its second level of stability then the pulses from generator 5 will have no effect thereon. The output of the scale-of-two circuit 6 before being applied to an integrator circuit 7 is restricted in time or sampled by means of a second gating circuit 8, also controlled by suitable trigger pulses, from the base pulse generator 5. In this case the gating pulses occur after the termination of the first named gate pulses and are given a duration which is somewhat less than that of the former pulses. After integrating the positive and negative pulsations obtained from gating circuit 8 a resultant variable voltage in the output of the circuit 7 is employed to control the gain of amplifier 2.

Figure 2:
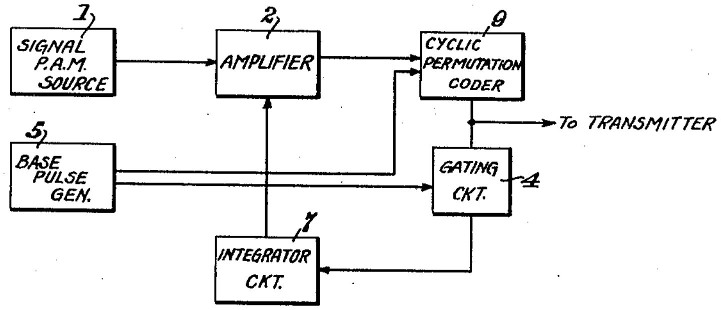
Fig. 2 is a diagram of another type of pulse code modulation system utilizing a signal volume control.

This idea is similarly applicable to systems using a so-called cyclic permutation coder in place of the binary pulse coder. This is illustrated in the system shown schematically in Fig. 2 wherein the elements which are similar to those used in the system of Fig. 1 bear the same reference numerals and where the binary coder has been replaced with a cyclic permutation coder shown at 9. Since each of the levels in a cyclic permutation coding system, as disclosed in more detail in my Spanish Patent No. 186,667 dated January 28, 1949, for "Signal Translation System," is given by a digital code system wherein adjacent levels of the code differ by the character of one element, the relative location of the respective levels may be recognized from the second digit which is isolated and applied directly to the integrating circuit 7 without undergoing the intermediary of a scale-of-two circuit 6 as in the system of Fig. 1; this will result in the recognition of the same range of levels as indicated for the circuit of Fig. 1.

Figure 3:
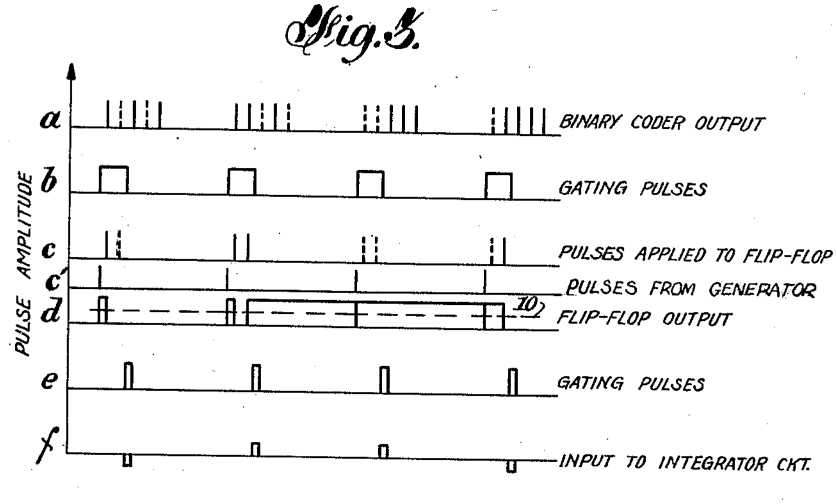
Figs. 3 and 4 are graphical representations of certain pulse phenomena interpreting the operation of the circuits of Figs. 1 and 2 respectively.
Figure 4:
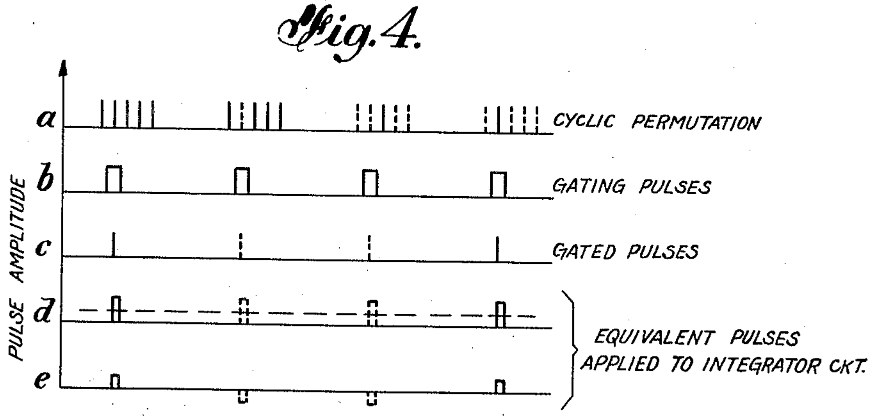

The graphs of Figs. 3 and 4 concern a message signal of wider dynamic range than could be conveniently transmitted over a given transmission system. If given pulses or pairs of pulses (such as the initial pair) in a series of code groups were predominately indicative of either high or low level signals, the input of the integrator circuit would be capable of substituting a control whereby the signals would be shifted to a median level (assuming a high concentration of quantization levels in the said median level).

Referring now to the pulse phenomena graphically represented in Figs. 3 and 4, the operation of the two systems will become apparent. The groups of pulses indicated in graph *a* of Fig. 3 represent the respective binary coder outputs for a system using, for example, a total of 32 distinctive levels, each level being represented by a 5 position or digit code, each position having half the value of the preceding one. Thus the values of the pulse groups shown are 21, 26, 7 and 15 respectively. In graph *b* are shown gating pulses as generated in the gating circuit 4 upon application thereto of synchronizing trigger or control pulses from the timing generator 5 which serve to isolate the first two digits of each of the code pulse groups in graph *a*, as outlined above. These isolated pulses or digits are indicated in graph *c* and are applied to control the output of the scale-of-two circuit 6. Whenever a pulse occurs at one of the two digits the prevailing condition of the output of circuit 6 is changed into the other of the two possible conditions. Furthermore as was pointed out hereinbefore the pulses from generator 5 also operate on circuit 6 to "flip" it into its second level of stability. Thus for example the first pulse of graph *c'* flips circuit 6 and the first pulse of graph *c* restores it to its first original level thus producing the first short pulse shown in graph *d*. The second short pulse shown in graph *d* is likewise similarly produced. The third pulse in graph *c* then flips the circuit as shown in graph *d* and the circuit remains on until it is flipped off by the last pulse of graph *c*. It is to be noted that the long pulse thus produced in graph *d* has two points of time at which pulses from the generator are applied to circuit 6 as indicated in graph *c'*. However as was pointed out hereinbefore since circuit 6 was already in "flipped" condition at these two points, these two pulses have no effect, remembering that pulses from the generator are connected so that they only "flip" circuit 6, unlike pulses applied from the gating circuit 4, and shown in graph *c*, which latter pulses change the stability of circuit 6 from whatever level of stability it is at to its other level of stability. The effect of this on the output of the circuit 6 is indicated in graph *d* wherefrom it is apparent that the "on" or "off" condition in the output thereof is a function of the presence or absence of isolated controlling code pulses in accordance with graph *c*. In graph *e*, the gating pulses obtained in circuit 8 due to a suitable trigger control from the pulse generator 5 and periodically occurring immediately following the termination of the gating pulses of graph *b* serve to isolate portions of the output of scale-of-two circuit 6 for application to the integrator 7. These isolated portions are either negative or positive in accordance with respective "on" or "off" condition of the output of circuit 6 in view of a reference base line which is shown displaced upwardly as at 10 in graph *d*. The pulses applied to the integrator circuit are indicated in graph *f*. The resulting amplitude variable voltage of the integrator 7 applied to the amplifier 2 serves to adjust the gain of said amplifier in such a way as to compress signal amplitudes which tend to fall into a level range which is above the range, ensuring a minimum of distortion due to quantizing; and which serves to increase the gain of the amplifier whenever the level range of the signal amplitudes falls below said optimum level amplitude distribution. Similarly the operation of the circuit of Fig. 2 may be ascertained from the inspection of the graphs of Fig. 4. Here, the pulse groups represented in graph *a* are those obtained from the cyclic permutation coder 9 which signify the same values as those computed for the binary coder of Fig. 1. Graph *b* again shows the gating pulses operative in the gating circuit 4 due to suitable timed triggering pulses from the generator 5, which serve to isolate the second digit of the pulse groups in graph *a* as shown in graph *c*, since for the level range selected, the second digit is fully significant. The actual pulses obtained from the code pulse groups from the gating circuit 4 and which have been shaped into a square or rectangular form are shown in graph *d* and are effectively made to act on integrator circuit 7 as shown in graph *e* in the form of positive and negative voltages in accordance with the presence or absence of pulsations at the isolated pulse digits. A corresponding amplitude modulated voltage wave is obtained for the control of the gain of amplifier 2 as before.

Figure 5:
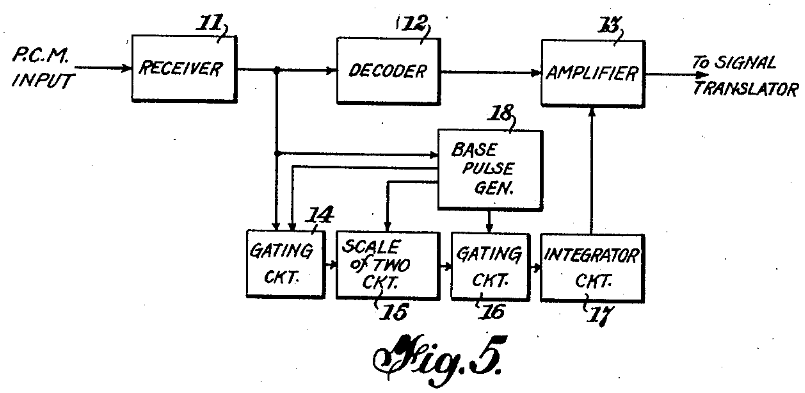
Fig. 5 is a diagram in block form of a corresponding receiver for the transmitter of Fig. 1.

The receiver circuit in Fig. 5 functions in the opposite sense of the transmitter of Fig. 1. It includes a receiver circuit 11 which feeds the received pulse groups into a decoder 12. The resulting amplitude modulated wave is applied to an amplifier 13 from which the wave is fed to a signal translator, which has not been shown. In order to obtain the required "compander" action, as indicated above, the received pulse groups are subjected to the action of a gating circuit 14 which serves to isolate the first one or two pulses of each pulse digit group received which in turn are made to control the action of a scale-of-two circuit 15 as explained in connection with Fig. 1. The resulting positive and negative pulsations of the circuit 15 are gated in the gating circuit 16, and finally integrated in an integrator 17 which provides an amplitude variable voltage for controlling the gain of the amplifier 13 to restore the original signal as supplied to the transmitter.

The receiver also serves to synchronize by any one of a number of known expedients the operation of a base pulse generator 18 with the transmitted signals which supplies triggering and control pulses at suitable frequencies and periods to circuits 14, 15 and 16.

From the above it can be seen that a volume control is essentially a variable gain amplifier controlled by a device which is sensitive either to the input level to the amplifier or to its output level. If the device is to be used in a communication system, means must be provided to enable the receiver to perform the opposite operation, that is to function as a volume expander. This can be achieved in three ways:

1. The indication of the input level may be separately transmitted to the receiver. This, however, has the disadvantages of requiring a special transmission channel.

2. The volume compression can be kept incomplete, so that the transmitted signal will vary in the same direction as the input, but by a small amount.

The receiver can then be made to detect these level variations and emphasize them. The disadvantages of this solution, which is found in the usual type of so-called "compander" is that perfect compression becomes impossible.

3. The method described in the present instance which as already explained comprises the transmission for each sampling of a group of pulses in accordance with pulse code modulation. Depending on the character of these pulses it is possible to recognize whether or not the input signal has exceeded some particular level. In accordance with the system discussed the operation is that the device will: (1) recognize whether a given voltage level has or has not exceeded at each sampling; (2) vary the gain by a small positive percentage if the level has not been exceeded and by a somewhat negative percentage if it has been exceeded. If the possibility of this level being exceeded by a perfectly compressed signal is given by a certain percentage, the positive and negative percentage gains have to assume a definite relationship. The same device can be used also to control the gain in the opposite sense and thus reconstruct the original signal system at the receiver.

As an example, the volume control system for a common type pulse code modulation system may operate with the following parameters.

For instance the number of samplings per second may be 8,000 and the probability that the compressed signal will lie within a given fractional range of the maximum level could be 60%. One of the requirements of the system is that the positive and negative percentages of gain are small so that such gain will not vary much from sampling to sampling. The ratio of the two percentage gains, the positive and negative one, will be adjusted in such a way that the sum of their values multiplied by the respective probability percentages associated therewith becomes zero, and assumes a corresponding resulting positive or negative value as the probability assumes larger or smaller values in respect to the 60% normal. Automatically the system is designed to act more rapidly in the increasing gain direction as compared to the direction of decreasing gain.

It may be thus seen that a dependable and quick acting volume control can be realized.

While I have described above the principles of my invention in connection with specific apparatus, it is to be clearly understood that this description is made only by way of example and not as a limitation on the scope of my invention.

I claim:

1. A system for minimizing the distortion of an amplitude modulated radio signal due to quantizing for conversion to pulse code modulation, comprising a source of an amplitude modulated signal, means for converting said signal into a series of pulse code groups representative of successive approximate signal levels for application to a pulse transmitter, means for producing a voltage representing the probable level amplitude distribution of subsequent quantized signal levels, and means for controlling the amplitude of said amplitude modulated signal in accordance with the probable level distribution voltage.

2. A system according to claim 1, wherein said converting means comprises a binary pulse coder.

3. A system according to claim 1 wherein said converting means comprises a binary pulse coder, and said producing means includes a first gating circuit for isolating given pulse positions of the output of said binary coder, means including a regularly-reset scale-of-two circuit coupled to the output of said first gating circuit for producing an output waveform determined by the presence of pulses in said given pulse positions, means including a second gating circuit for periodically sampling the said output waveform, and means including an integrator for integrating the gated output of said second gating circuit to provide a control voltage for said source.

4. A system according to claim 1, wherein said converting means comprises a cyclic permutation coder.

5. A system according to claim 4, wherein said producing means includes a gating circuit for isolating a given pulse position of said cyclic permutation coder and means including an integrator for the gated output of said coder to provide a control voltage for integrating said source.

6. A system according to claim 1, wherein said producing means includes means for isolating a given initial number of the pulses of each of said pulse groups, and means for converting said isolated pulses into a control voltage varying according to the presence or absence of the isolated pulses.

7. A system for minimizing the distortion of an amplitude modulated radio signal due to quantizing for conversion to pulse code modulation comprising a source of an amplitude modulated signal, an amplifier for said signal, a binary pulse coder for said amplified signal, means including a first gating circuit for isolating a given number of pulse positions of each of the pulse groups from said coder, means including a regularly-reset scale-of-two circuit coupled to the output of said first gating circuit for producing an output waveform determined by the presence or absence of pulses in said isolated pulse positions, means including a second gating circuit coupled to the output of said scale-of-two circuit, for periodically sampling said output waveform, means including an integrator for integrating said gated output of said second gating circuit to produce a control voltage, means for applying said control voltage from said integrator to said amplifier to adjust the amplification thereof, and a timing pulse generator for the control of said coder, said first and second gate circuits and the resetting of said scale-of-two circuit.

8. A system for minimizing the distortion of an amplitude modulated radio signal due to quantizing for conversion to pulse code modulation comprising a source of an amplitude modulated signal, an amplifier for amplifying said signals, means including a cyclic permutation pulse coder for converting said amplified signal into a corresponding pulse code, means including a gating circuit for isolating a given number of pulse positions of each of the pulse groups from said coder, means including an integrator controlled by the gated output of said coder for integrating said gated output to produce a control voltage, means for applying said control voltage from said integrator to said amplifier to control the amplification thereof, and a timing pulse generator for the control of said coder, and said gate circuit.

PIERRE RAOUL AIGRAIN.

No references cited.